*(12)* United States Patent
Chen et al.

(10) Patent No.: US 11,755,084 B2
(45) Date of Patent: Sep. 12, 2023

(54) COOLING CIRCUITS FOR COOLING A COMPUTING SYSTEM AND FLOW CONTROL METHODS THEREOF

(71) Applicant: QUANTA COMPUTER INC., Taoyuan (TW)

(72) Inventors: Yi-Chieh Chen, Taoyuan (TW); Yueh-Chang Wu, Taoyuan (TW); Te-Chuan Wang, Taoyuan (TW); Tzu-Hsuan Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 57 days.

(21) Appl. No.: 17/380,845

(22) Filed: Jul. 20, 2021

(65) Prior Publication Data

US 2023/0025554 A1 Jan. 26, 2023

(51) Int. Cl.
*G06F 1/20* (2006.01)
*H05K 7/20* (2006.01)

(52) U.S. Cl.
CPC ......... *G06F 1/206* (2013.01); *H05K 7/20281* (2013.01); *G06F 2200/201* (2013.01)

(58) Field of Classification Search
CPC .............. G06F 1/206; G06F 2200/201; H05K 7/20254; H05K 7/20272; H05K 7/20281
USPC ....................................................... 700/300
See application file for complete search history.

(56) References Cited

U.S. PATENT DOCUMENTS

| | | | |
|---|---|---|---|
| 7,318,322 B2 | 1/2008 | Ota et al. | |
| 7,602,609 B2 | 10/2009 | Spearing et al. | |
| 10,459,498 B1* | 10/2019 | Kinstle, III | ........ H05K 7/20272 |
| 2004/0221604 A1* | 11/2004 | Ota | ..................... H05K 7/20781 |
| | | | 361/691 |

(Continued)

FOREIGN PATENT DOCUMENTS

| | | | |
|---|---|---|---|
| JP | 2004-246649 A | 9/2004 | |
| JP | 2005-274062 A | 10/2005 | |

(Continued)

OTHER PUBLICATIONS

Extended European Search Report for EP Application No. 21199658.2, dated Mar. 17, 2022.

(Continued)

*Primary Examiner* — Chun Cao
(74) *Attorney, Agent, or Firm* — NIXON PEABODY LLP (57) ABSTRACT

A cooling system for a rack of servers includes a plurality of cooling circuits, where each cooling circuit is coupled to a server of the rack. Each cooling circuit includes a plurality of cooling modules arranged in parallel. Each cooling module includes a cold plate having a cooling conduit passing therethrough, and a pump fluidly coupled to the cooling conduit. The cooling circuit further includes one or more valves fluidly interconnecting the plurality of cooling modules. Each of the one or more valves, when turned on, fluidly connects the cooling conduits of any two adjacent cooling modules. The cooling system further includes a first cooling distribution manifold fluidly connected to the cooling circuit of each of the plurality of servers through an inlet pipe, and a second cooling distribution manifold fluidly connected to the cooling circuit of each of the plurality of servers through an outlet pipe.

14 Claims, 11 Drawing Sheets

(56) References Cited

U.S. PATENT DOCUMENTS

| | | | |
|---|---|---|---|
| 2005/0122684 A1* | 6/2005 | Chu | H05K 7/2079 361/698 |
| 2008/0298019 A1* | 12/2008 | Spearing | H05K 7/2079 361/689 |
| 2012/0106083 A1* | 5/2012 | Toftloekke | H01L 23/473 361/698 |
| 2017/0068258 A1* | 3/2017 | Lyon | G05D 7/0635 |

FOREIGN PATENT DOCUMENTS

| | | |
|---|---|---|
| JP | 2009-216346 A | 9/2009 |
| JP | 2010-528486 A | 8/2010 |
| TW | 200417843 A | 9/2004 |
| TW | 200528952 A | 9/2005 |
| WO | 2020234599 A1 | 11/2020 |

OTHER PUBLICATIONS

TW Office Action for Application No. 110133913, dated Jun. 23, 2022, w/ First Office Action Summary.
TW Search Report for Application No. 110133913, dated Jun. 23, 2022, w/ First Office Action.
JP Office Action for Application No. 2021-185096, dated Jan. 10, 2023, w/ First Office Action Summary.

* cited by examiner

COOLING CIRCUITS FOR COOLING A COMPUTING SYSTEM AND FLOW CONTROL METHODS THEREOF

CROSS-REFERENCE TO RELATED APPLICATIONS

This application claims priority from and benefit of U.S. Provisional Application No. 63/182,360, entitled "Flowing Control Method For The Liquid Cooling System," and filed on Apr. 30, 2021. The contents of that application are hereby incorporated by reference in their entirety.

FIELD OF THE INVENTION

The present invention relates generally to systems and method for cooling a computing system, and more specifically, to cooling circuits for cooling a computing system and flow control methods thereof.

BACKGROUND OF THE INVENTION

Computing devices (such as servers) typically contain one or more heat-generating components, such as a central processing unit (CPU), a graphics processing unit (GPU), and others. To aid in cooling these heat-generating components, cooling modules containing pumps for driving a cooling fluid and transferring heat away from the heat-generating components may be used. However, when a pump in any one of the cooling modules fails, at least the cooling module with the failed pump becomes unable to cool the heat-generating components thermally coupled thereto and may also affect any cooling module connected in series.

Accordingly, it is desirable to have better cooling solutions that can ensure pump redundancy during operation such that heat from the heat-generating components in all parts of the computing devices can continue to be effectively removed.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a cooling circuit for cooling a computing system is disclosed. The cooling circuit includes a plurality of cooling modules arranged in parallel. Each cooling module includes a cold plate having a cooling conduit passing therethrough, and a pump fluidly coupled to the cooling conduit. The cooling circuit further includes one or more valves fluidly interconnecting the plurality of cooling modules. Each of the one or more valves, when turned on, fluidly connects the cooling conduits of any two adjacent cooling modules.

According to certain aspects of the present disclosure, a cooling system for a rack of servers is disclosed. The cooling system includes a plurality of cooling circuits, where each cooling circuit is coupled to a server of the rack. Each cooling circuit includes a plurality of cooling modules arranged in parallel. Each cooling module includes a cold plate having a cooling conduit passing therethrough, and a pump fluidly coupled to the cooling conduit. The cooling circuit further includes one or more valves fluidly interconnecting the plurality of cooling modules. Each of the one or more valves, when turned on, fluidly connects the cooling conduits of any two adjacent cooling modules. The cooling system further includes a first cooling distribution manifold fluidly connected to the cooling circuit of each of the plurality of servers through an inlet pipe, and a second cooling distribution manifold fluidly connected to the cooling circuit of each of the plurality of servers through an outlet pipe.

According to certain aspects of the present disclosure, each cooling module further includes an inlet tube and an outlet tube. The inlet tube has a first end coupled to a first quick connector and a second end coupled to an inlet of the cooling conduit. The outlet tube has a first end coupled to an outlet of the cooling conduit and a second end coupled to a second quick connector.

According to certain aspects of the present disclosure, the one or more valves is a four-pass actuated ball valve, or a four-pass valve formed by three two-pass solenoid valves.

According to certain aspects of the present disclosure, the cooling circuit includes two cooling modules interconnected by one valve.

According to certain aspects of the present disclosure, each of the plurality of cooling modules is disposed above a heat-generating component of the corresponding server.

According to certain aspects of the present disclosure, the cooling system further includes a cooling distribution unit disposed on the rack of servers for distributing a cooling fluid to the first cooling distribution manifold and receiving the cooling fluid from the second cooling distribution manifold.

According to certain aspects of the present disclosure, the cooling distribution unit further includes one or more sensors, a cooling distribution pump, and a programmable logic controller. The sensors are configured to detect one or more flow parameters of the cooling fluid. The cooling distribution pump is configured to controllably distribute the cooling fluid. The programmable logic controller is configured to control the flow rate of the cooling fluid from the cooling distribution pump based on data received on the one or more flow parameters of the cooling fluid.

According to certain aspects of the present disclosure, each cooling circuit is communicatively coupled to a controller in the corresponding server. The controller is configured to detect whether one or more of the pumps in the plurality of cooling modules has failed. The controller is further configured to turn on the one or more valves fluidly connecting the cooling conduit of the cooling module having each of the one or more failed pumps with the cooling conduit of an adjacent cooling module, in response to such detection.

According to certain aspects of the present disclosure, the controller is further configured to receive temperature information of a heat-generating component thermally connected with the cold plate from a temperature sensor in the corresponding server. The controller is further configured to adjust an electrical power load on the heat-generating component, in response to detecting that the one or more of the pumps in the plurality of cooling modules has failed.

According to certain aspects of the present disclosure, the controller is further configured to send an alarm to an operator, in response to detecting at least that all but one of the pumps in the plurality of cooling modules has failed.

According to certain aspects of the present disclosure, the controller is further configured to detect whether the one or more pumps has failed by receiving information on the revolutions per minute (RPM) of the one or more pumps, and determining whether the RPM of any of the one or more pumps is outside a predetermined range of values.

According to certain aspects of the present disclosure, a flow control method for a cooling circuit of a computing system is disclosed. The method includes cooling the computing system via a plurality of cooling modules, where each cooling module has a pump fluidly connected to a cooling conduit that passes through a cold plate of the cooling module. The method further includes detecting failure of a pump in one or more of the plurality of cooling modules. The method further includes in response to detecting the failure, turning on a valve to flow a coolant between the cooling conduit fluidly connected to each of the failed pumps and the cooling conduit of an adjacent cooling module.

According to certain aspects of the present disclosure, the method further includes adjusting electrical power load on a heat-generating component thermally coupled to the cooling circuit, in response to detecting the failure.

According to certain aspects of the present disclosure, the method further includes sending an alarm to an operator, in response to detecting at least that all but one of the pumps in the plurality of cooling modules have failed.

According to certain aspects of the present disclosure, the method detects the failure of a pump in one or more of the plurality of cooling modules by receiving information on the revolutions per minute (RPM) of the one or more pumps and determining whether the RPM of any of the one or more pumps is outside a predetermined range of values.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Embodiments of the disclosure are directed to cooling circuits for cooling a computing system and flow control methods thereof. The cooling circuits include a plurality of cooling modules arranged in parallel and interconnected by one or more valves that, when turned on, fluidly connects adjacent cooling modules. This ensures that a cooling fluid can flow across the plurality of cooling modules, if a pump for driving the cooling fluid in any one of the plurality of cooling modules fails. The flow control methods for the cooling circuit are executed by a controller that detects the failed pump and turns on the valve between adjacent cooling modules such that the cooling fluid can flow through. In response to such detection, the controller may also adjust the electrical power load of a heat-generating component thermally coupled to the cooling module having the failed pump. The controller is also configured to send an alarm to an operator, in the event all but one of the pumps in the plurality of cooling modules have failed.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1:
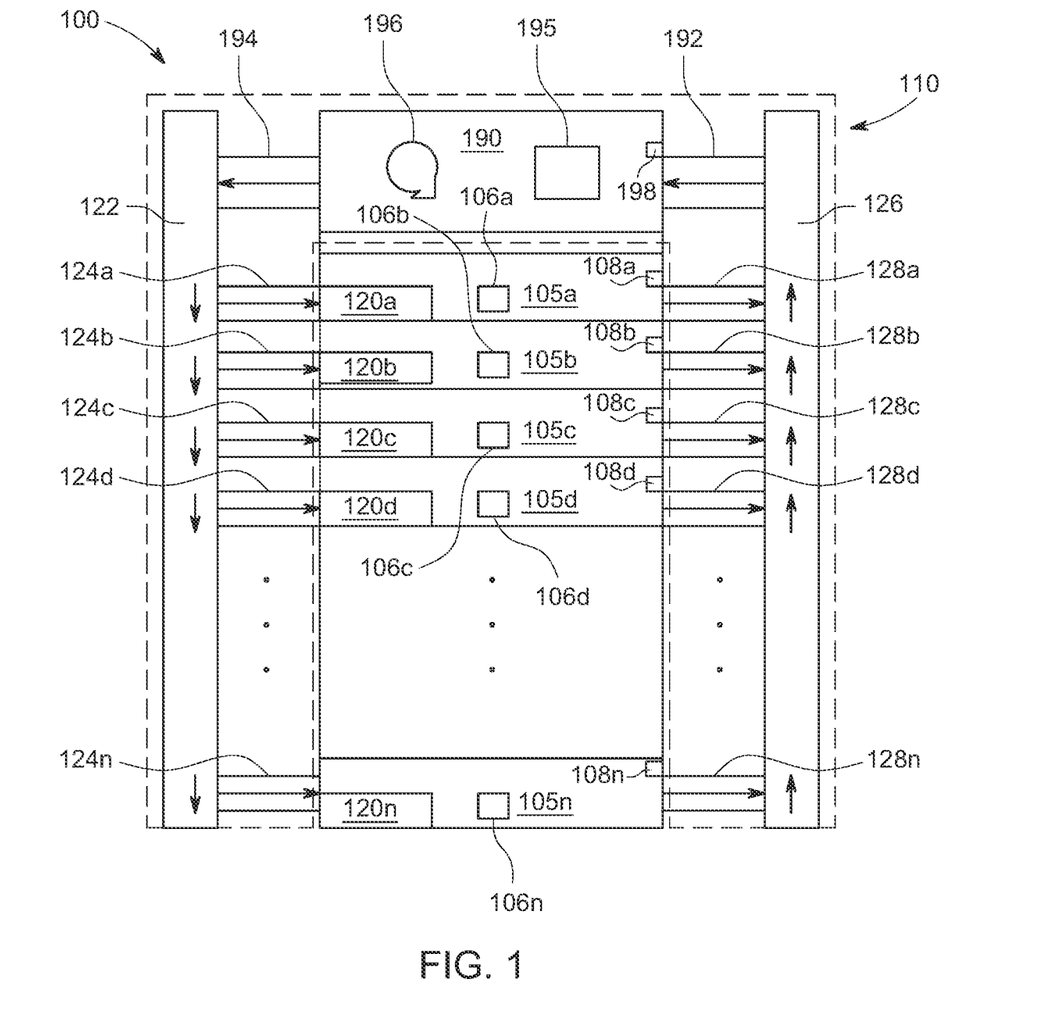
FIG. 1 shows a side view of a schematic depiction of a rack of servers with the cooling system having a plurality of cooling circuits, according to certain aspects of the present disclosure.

FIG. 1 shows a side view of a schematic depiction of a rack 100 of 'n' servers 105a, 105b, . . . , 105n. The letter 'n' is used throughout this specification to denote a plurality of components and represents an integer greater than two. The rack 100 has a cooling system 110 with a plurality of cooling circuits 120a, 120b, . . . , 120n. Each cooling circuit 120n is coupled to and disposed within each server 105n of the rack 100. Each of the plurality of cooling circuits 120a, 120b, . . . , 120n is communicatively coupled to a corresponding controller 106a, 106b, . . . , 106n in the respective server 105a, 105b, . . . , 105n. Each controller 106n is configured to control the flow of a cooling fluid through the corresponding cooling circuit 120n and undertake actions to ensure continuity and effectiveness of cooling performed thereby.

The cooling system 110 includes a first cooling distribution manifold 122 fluidly connected to the cooling circuits 120a, 120b, . . . , 120n of the respective servers 105a, 105b, . . . , 105n through inlet pipes 124a, 124b, . . . , 124n for distributing a cooling fluid into each of the cooling circuits 120a, 120b, . . . , 120n. The cooling system 110 further includes a second cooling distribution manifold 126 fluidly connected to the cooling circuits 120a, 120b, . . . , 120n of the respective servers 105a, 105b, . . . , 105n through outlet pipes 128a, 128b, . . . , 128n for removing the cooling fluid from each of the cooling circuits 120a, 120b, . . . , 120n. In some embodiments, the first cooling distribution manifold 122 and the second cooling distribution manifold 126 may be made from aluminum, stainless steel, and the like. Temperature sensors 108a, 108b, . . . , 108n are disposed adjacent to the outlet pipes 128a, 128b, . . . , 128n within each of the servers 105a, 105b, . . . , 105n.

The cooling system 110 includes a cooling distribution unit 190 disposed on the rack 100. The cooling distribution unit 190 distributes a cooling fluid to the first cooling distribution manifold 122 and receives the cooling fluid from the second cooling distribution manifold 126. The cooling distribution unit 190 includes one or more sensors 198, a cooling distribution pump 196, and a programmable logic controller 195. The sensor(s) 198 are configured to detect one or more flow parameters of the cooling fluid. As non-limiting examples, the flow parameters may be pressure, flow rate, and the like. The cooling distribution pump 196 is configured to controllably distribute the cooling fluid. The programmable logic controller 195 is configured to control the flow rate of the cooling fluid from the cooling distribution pump 196 based on data received on the flow parameters of the cooling fluid from the sensor(s) 198.

Figure 2A:
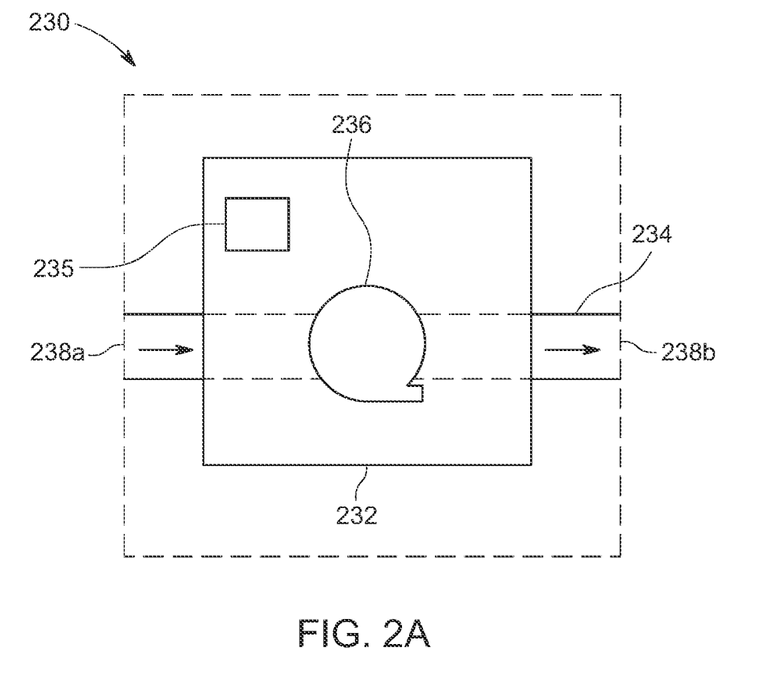
FIG. 2A shows a side view of a first embodiment of a cooling module disposed in each of the plurality of cooling circuits of FIG. 1, according to certain aspects of the present disclosure.
Figure 2B:
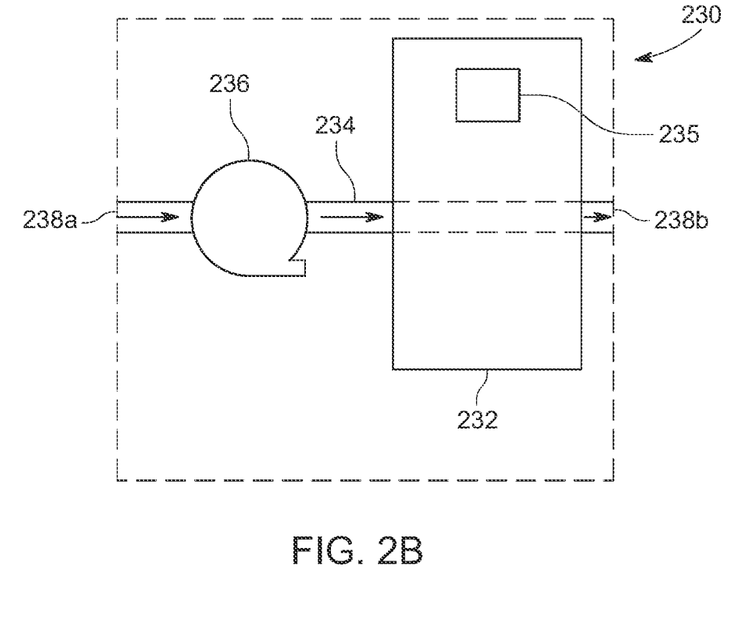
FIG. 2B shows a side view of a second embodiment of a cooling module disposed in each of the plurality of cooling circuits of FIG. 1, according to certain aspects of the present disclosure.

FIGS. 2A-2B show side views of a first embodiment and a second embodiment of a cooling module 230 disposed in each of the plurality of cooling circuits 120a, 120b, . . . , 120n (FIG. 1). The cooling modules 230 is positioned (e.g., disposed above, disposed under, etc.) to be thermally coupled to a heat-generating component 235 (e.g., a processor, memory card, etc.) of the server 105n. The cooling module 230 includes a cold plate 232 having a cooling conduit 234 passing therethrough. The cooling conduit 234 has an inlet 238a and an outlet 238b. A cooling fluid enters the cooling module 230 through the inlet 238a and exits the cooling module 230 through the outlet 238b. A pump 236 is fluidly coupled to the cooling conduit 234 for distributing the cooling fluid to and from the cooling module 230. The pump 236 may be in fluid contact with the cold plate 232, as shown in the first embodiment of FIG. 2A. The pump 236 may also be in fluid contact with the cooling conduit 234, as shown in the second embodiment of FIG. 2B.

Figure 3A:
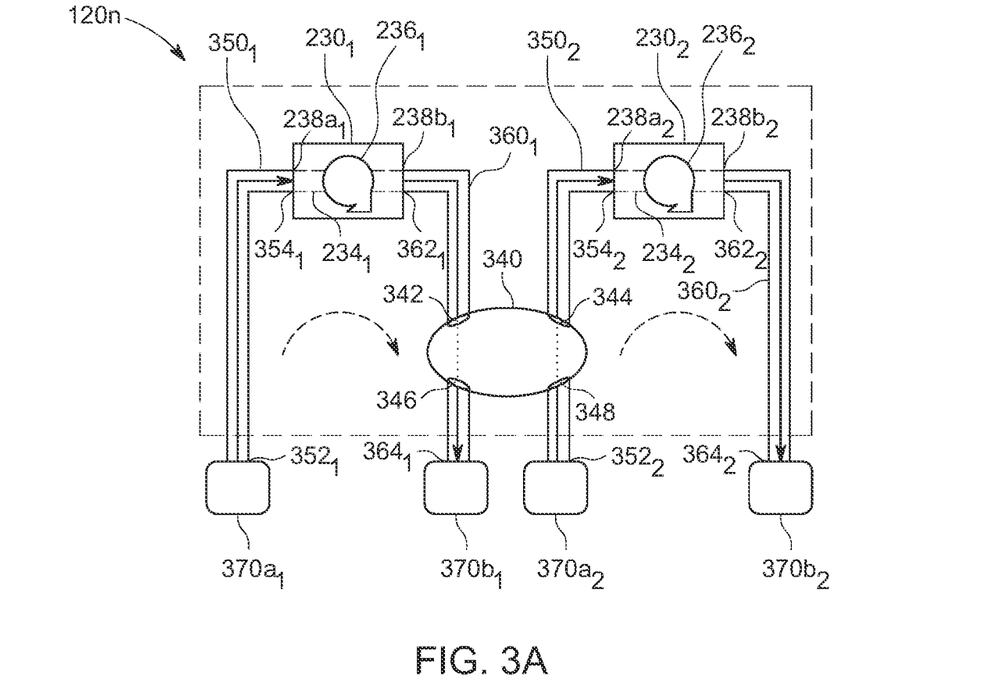
FIG. 3A shows a top view of a schematic depiction of two adjacent cooling circuits interconnected by one valve that is turned off, according to certain aspects of the present disclosure.
Figure 3B:
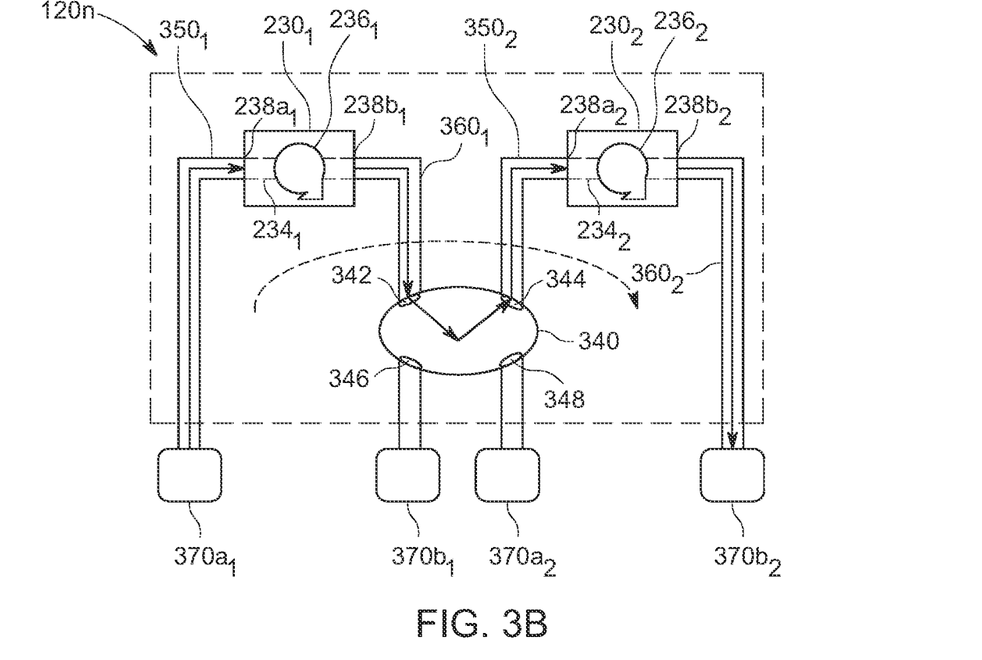
FIG. 3B shows a top view of a schematic depiction of two adjacent cooling circuits interconnected by one valve that is turned on to allow cooling fluid to flow between the cooling circuits, according to certain aspects of the present disclosure.

The plurality of cooling modules 230 in each cooling circuit 120n are shown in further detail in FIGS. 3A-3B and FIGS. 4A-4B. The plurality of cooling modules 230 are interconnected by one or more valves (e.g., valve 340 in FIGS. 3A-3B) that, when turned on, fluidly connect the cooling conduits 234 of adjacent cooling modules 230. FIGS. 3A-3B show top views of a schematic depiction of an example arrangement of two adjacent cooling modules $230_1$, $230_2$ arranged in parallel and interconnected by one valve 340 that is initially turned off (FIG. 3A) and then turned on to allow cooling fluid to flow between the adjacent cooling modules $230_1$, $230_2$ (FIG. 3B). The cooling module $230_1$ is thermally coupled to a heat-generating component (not shown). As shown in FIG. 3A, the cooling module $230_1$ includes a pump $236_1$ fluidly connected to a cooling conduit $234_1$ having an inlet $238a_1$ and an outlet $238b_1$. An inlet tube $350_1$ having a first end $352_1$ and a second end $354_1$ carries a cooling fluid into the cooling module $230_1$. The first end $352_1$ of the inlet tube $350_1$ is coupled to a first quick connector $370a_1$ and the second end $354_1$ of the inlet tube $350_1$ is coupled to the inlet $238a_1$ of the cooling conduit $234_1$. An outlet tube $360_1$ having a first end $362_1$ and a second end $364_1$ carries the cooling fluid out of the cooling module $230_1$. The first end $362_1$ of the inlet tube $360_1$ is coupled to the outlet $238b_1$ of the cooling conduit $234_1$ and the second end $364_1$ is coupled to a second quick connector $370b_1$. In some embodiments, the first quick connector $370a_1$ and the second quick connector $370b_1$ are plug-and-socket structures made from aluminum, stainless steel, copper, nickel, and the like. The arrows through the inlet tube $350_1$, the cooling conduit $234_1$, and the outlet tube $360_1$ indicate direction of flow of the cooling fluid through the cooling module $230_1$.

Similarly, the cooling module $230_2$ is thermally coupled to a heat-generating component (not shown). As shown in FIG. 3A, the cooling module $230_2$ includes a pump $236_2$ fluidly connected to a cooling conduit $234_2$ having an inlet $238a_2$ and an outlet $238b_2$. An inlet tube $350_2$ having a first end $352_2$ and a second end $354_2$ carries a cooling fluid into the cooling module $230_2$. The first end $352_2$ of the inlet tube $350_2$ is coupled to a first quick connector $370a_2$ and the second end $354_2$ of the inlet tube $350_2$ is coupled to the inlet $238a_2$ of the cooling conduit $234_2$. An outlet tube $360_2$ having a first end $362_2$ and a second end $364_2$ carries the cooling fluid out of the cooling module $230_2$. The first end $362_2$ of the inlet tube $360_2$ is coupled to the outlet $238b_2$ of the cooling conduit $234_2$, and the second end $364_2$ is coupled to a second quick connector $370b_2$. In some embodiments, the first quick connector $370a_2$ and the second quick connector $370b_2$ are plug-and-socket structures made from aluminum, stainless steel, copper, nickel, and the like. The arrows through the inlet tube $350_2$, the cooling conduit $234_2$, and the outlet tube $360_2$ indicate direction of flow of the cooling fluid through the cooling module $230_2$.

In the example arrangement of FIGS. 3A-3B, the cooling modules $230_1$, $230_2$ are interconnected by a single valve 340 having four ports 342, 344, 346, and 348. As shown and described below, the valve 340 may be a four-pass actuated ball valve, a four-pass valve formed by three two-pass solenoid valves (see FIGS. 6A-6B), and the like. Two ports 342, 346 are fluidly coupled to the outlet tube $360_1$ of the cooling module $230_1$, and two ports 344, 348 are fluidly coupled to the inlet tube $350_2$ of the cooling module $230_2$. As shown in FIG. 3A, the valve 340 is initially turned off, and the cooling fluid flows independently through each of the cooling modules 2301, $230_2$. When the valve 340 is turned on, as shown in FIG. 3B triggered by an event (e.g., when one of the pumps $236_1$ or $236_2$ fails) as described below, the cooling fluid from the outlet tube $360_1$ of the cooling module $230_1$ is guided through the ports 342 and 344 of the valve 340 into the inlet tube $350_2$ of the adjacent cooling module $230_2$. This ensures that heat from the heat-generating components thermally coupled to the cooling modules $230_1$, $230_2$ can continue to be effectively removed.

Figure 4A:
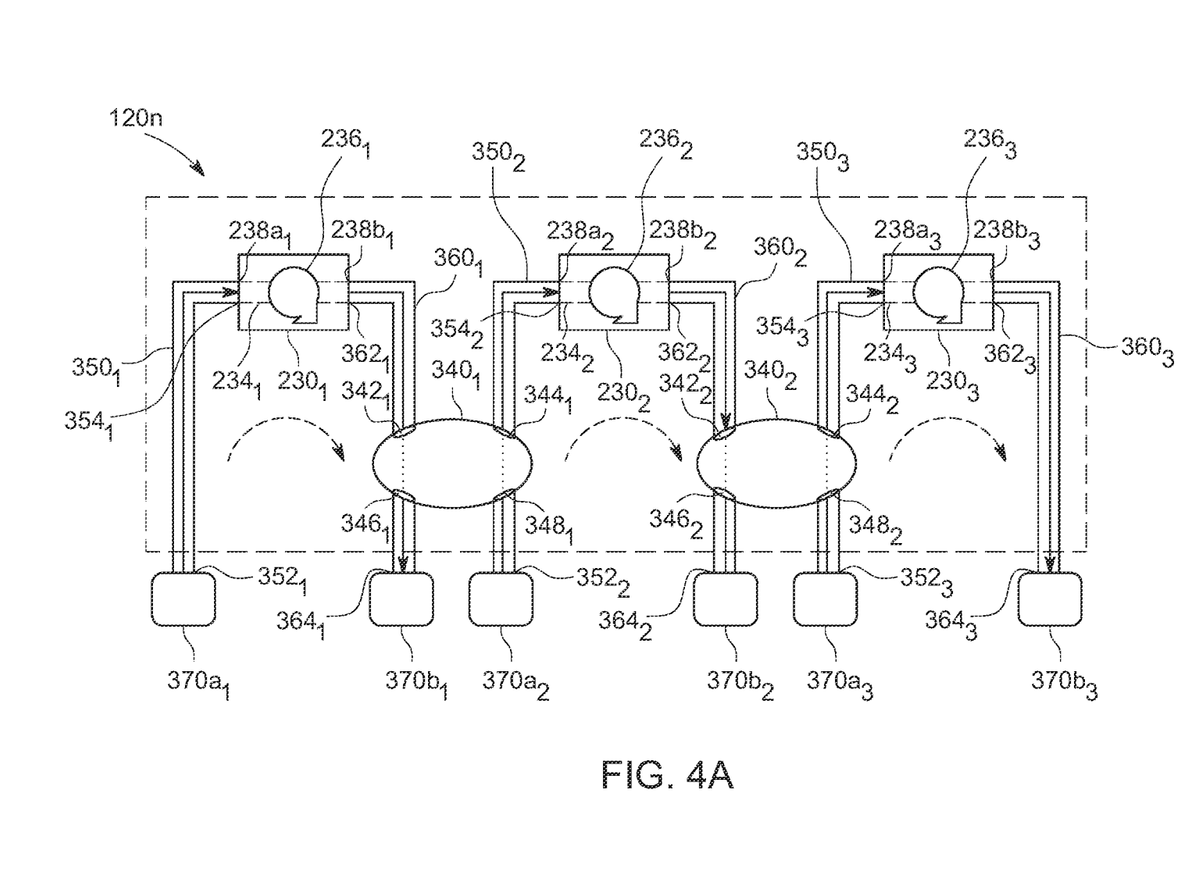
FIG. 4A shows a top view of a schematic depiction of three adjacent cooling circuits interconnected by two valves that are turned off, according to certain aspects of the present disclosure.
Figure 4B:
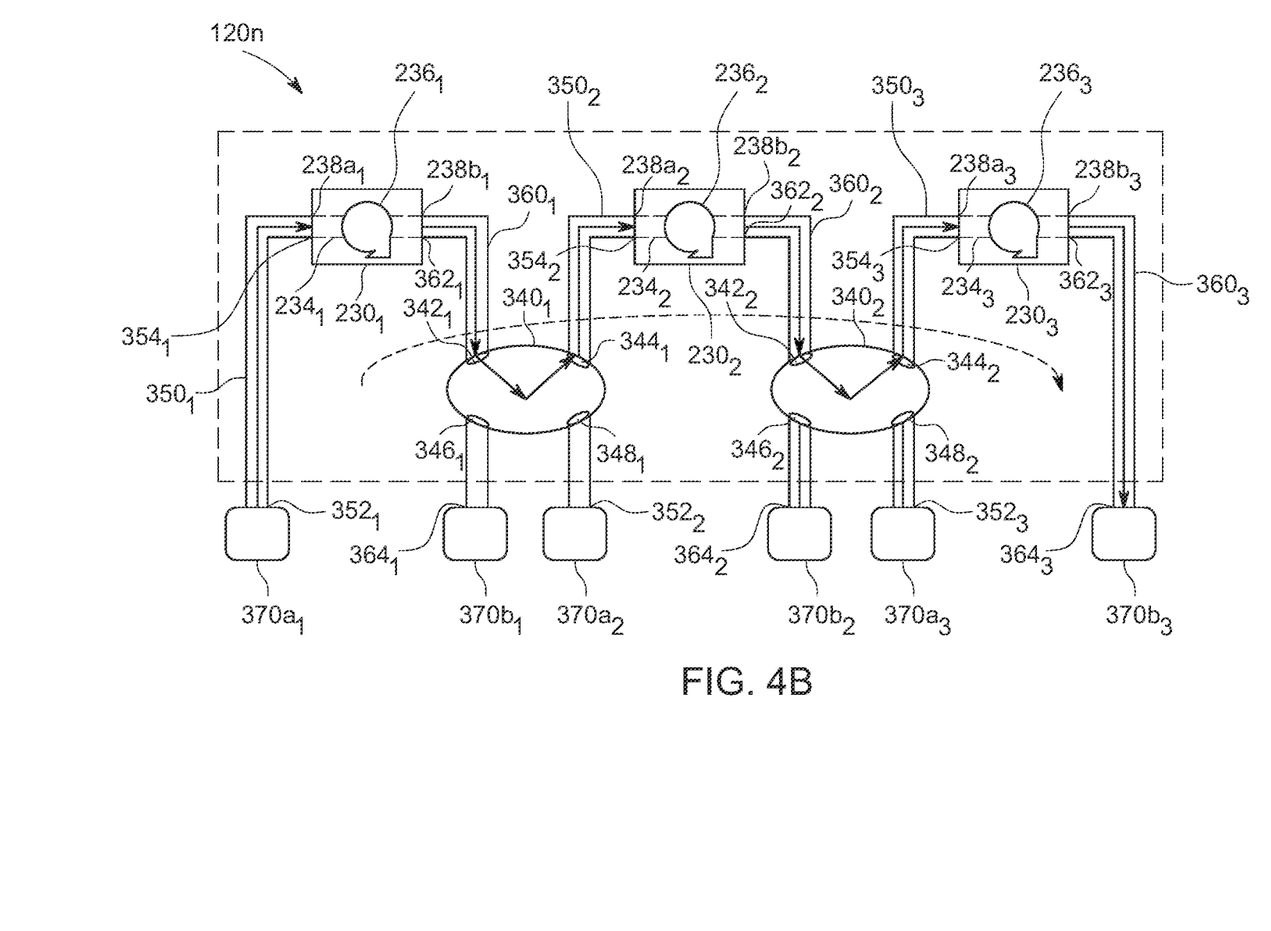
FIG. 4B shows a top view of a schematic depiction of three adjacent cooling circuits interconnected by the two valves that are turned on to allow cooling fluid to flow among the adjacent cooling circuits, according to certain aspects of the present disclosure.

FIGS. 4A-4B show top views of a schematic depiction of another example arrangement of three adjacent cooling modules $230_1$, $230_2$, $230_3$ arranged in parallel and interconnected by two valves $340_1$, $340_2$. The valves $340_1$, $340_2$ are initially turned off (FIG. 4A) and then both are turned on (though only one of the valves may be turned on as necessary) to allow cooling fluid to flow through the adjacent cooling modules $230_1$, $230_2$, $230_3$ (FIG. 4B). The cooling modules $230_1$, $230_2$ are similar in structure and function, as described above with respect to FIGS. 3A-3B. The cooling module $230_3$ is thermally coupled to a heat-generating component (not shown). As shown in FIG. 4A, the cooling module $230_3$ includes a pump $236_3$ fluidly connected to a cooling conduit $234_3$ having an inlet $238a_3$ and an outlet $238b_3$. An inlet tube $350_3$ having a first end $352_3$ and a second end $354_3$ carries a cooling fluid into the cooling module $230_3$. The first end $352_3$ of the inlet tube $350_3$ is coupled to a first quick connector $370a_3$, and the second end $354_3$ of the inlet tube $350_3$ is coupled to the inlet $238a_3$ of the cooling conduit $234_3$. An outlet tube $360_3$ having a first end $362_3$ and a second end $364_3$ carries the cooling fluid out of the cooling module $230_3$. The first end $362_3$ of the inlet tube $360_3$ is coupled to the outlet $238b_3$ of the cooling conduit $234_3$, and the second end $364_3$ is coupled to a second quick connector $370b_3$. In some embodiments, the first quick connector $370a_3$ and the second quick connector $370b_3$ are plug-and-socket structures made from aluminum, stainless steel, copper, nickel, and the like. The arrows through the inlet tube $350_3$, the cooling conduit $234_3$, and the outlet tube $360_3$ indicate direction of flow of the cooling fluid through the cooling module $230_3$.

In the example arrangement of FIGS. 4A-4B, the cooling modules $230_1$, $230_2$, $230_3$ are interconnected by two valves $340_1$, $340_2$, similar to the valve 340. The valve $340_1$ has four ports $342_1$, $344_1$, $346_1$, and $348_1$. Two ports $342_1$, $346_1$ are fluidly coupled to the outlet tube $360_1$ of the cooling module $230_1$, and two ports $344_1$, $348_1$ are fluidly coupled to the inlet tube $350_2$ of the cooling module $230_2$. Similarly, the valve $340_2$ has four ports $342_2$, $344_2$, $346_2$, and $348_2$. Two ports $342_2$, $346_2$ are fluidly coupled to the outlet tube $360_2$ of the cooling module $230_2$, and two ports $344_2$, $348_2$ are fluidly coupled to the inlet tube $350_3$ of the cooling module $230_3$.

As shown in FIG. 4A, the valves $340_1$, $340_2$ are initially turned off, and the cooling fluid flows independently through each of the cooling modules $230_1$, $230_2$, $230_3$. When the valves $340_1$, $340_2$ are turned on, as shown in FIG. 4B triggered by an event (e.g., when one of the pumps $236_1$, $236_2$, or $236_3$ fails) as described below, the cooling fluid from the outlet tube $360_1$ of the cooling module $230_1$ is guided through the ports $342_1$ and $344_1$ of the valve $340_1$ into the inlet tube $350_2$ of the cooling module $230_2$. Similarly, the cooling fluid from the outlet tube $360_2$ of the cooling module $230_2$ is guided through the ports $342_2$ and $344_2$ of the valve $340_2$ into the inlet tube $350_3$ of the cooling module $230_3$. This ensures that heat from the heat-generating components thermally coupled to the cooling modules $230_1$, $230_2$, $230_3$ can continue to be effectively removed. As illustrated through FIGS. 3A-3B and FIGS. 4A-4B, a plurality of cooling modules 230 can be interconnected through one or more valves 340 to achieve pump redundancy in the cooling circuit $120n$, thereby ensure continuity and effectiveness of cooling of each of the servers $105n$.

Figure 5A:
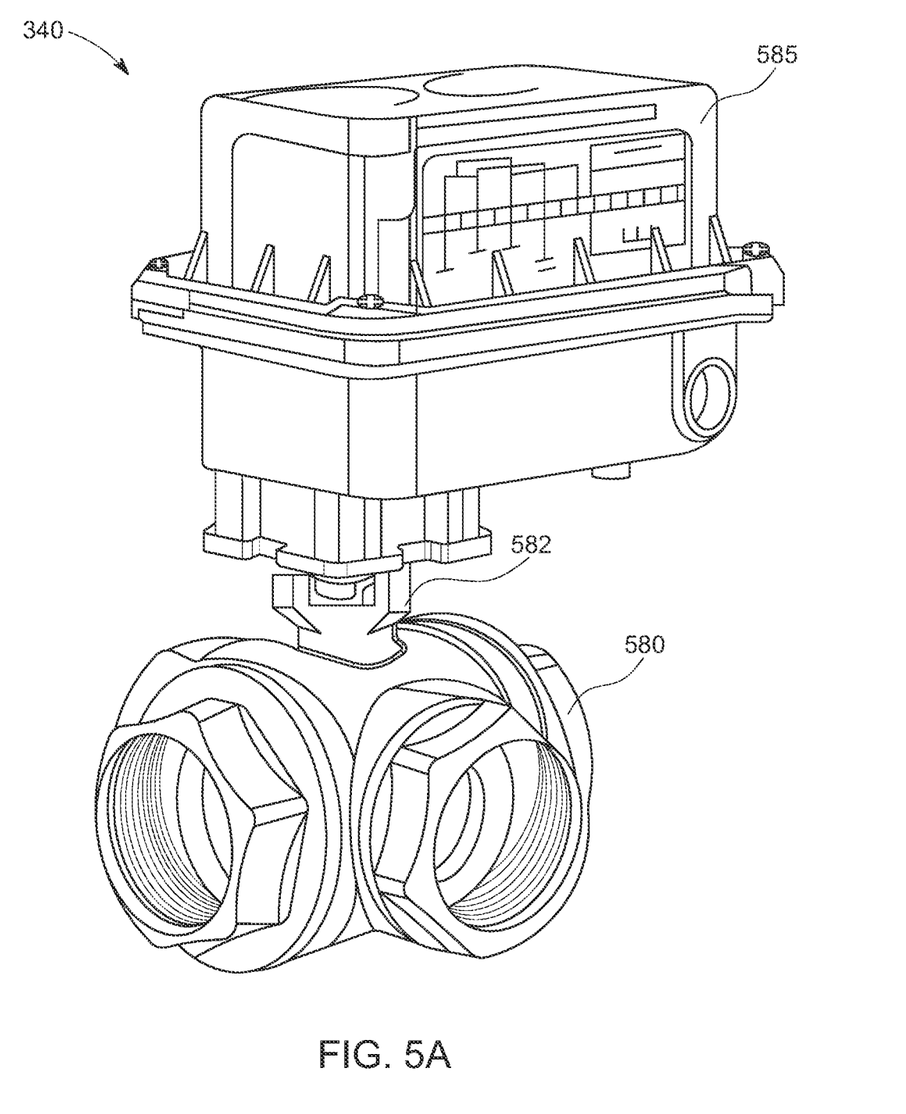
FIG. 5A shows a perspective view of a first embodiment of a valve used for interconnecting the adjacent cooling circuits, according to certain aspects of the present disclosure.
Figure 5B:
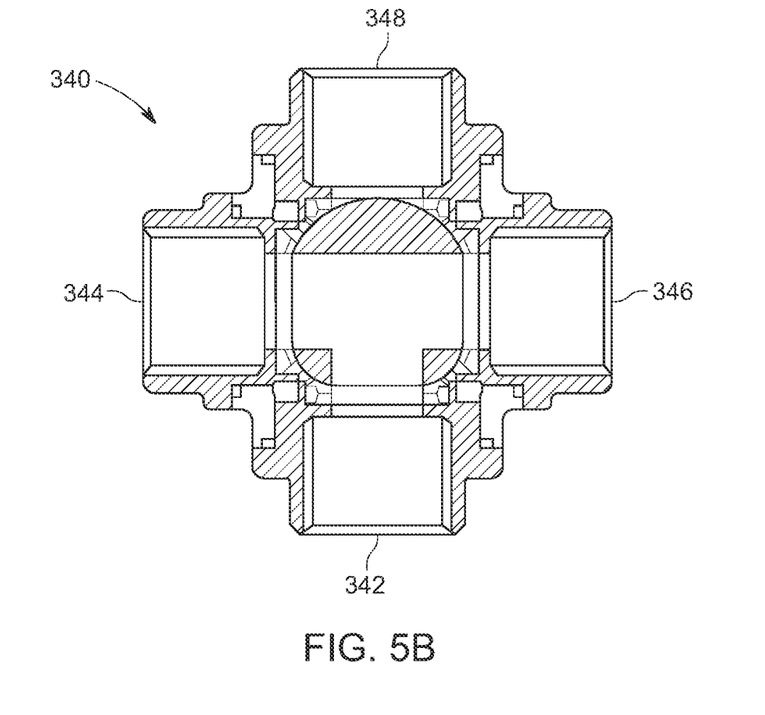
FIG. 5B shows a top view of the valve of FIG. 5A, according to certain aspects of the present disclosure.

FIGS. 5A-5B show a perspective view and a top view respectively, of a first embodiment of the valve 340 used for interconnecting the adjacent cooling circuits. As shown in FIG. 5A, the valve 340 is a four-pass actuated ball valve. The valve 340 has a four-channeled structure 580 and a controlling unit 585 coupled to the four-channeled structure 580 through a connector 582. The four-channeled structure 580 has four ports 342, 344, 346, and 348, as shown in FIG. 5B (see also, FIGS. 3A-3B). In some embodiments, the four-channeled structure 580 is made from stainless steel.

In some embodiments, the controlling unit 585 is made from a polycarbonate material. The controlling unit 585 is configured to receive an input signal from a controller (e.g., the controller 106n of each server 105n) to adjust the position of the ports 342, 344, 346, and 348 in order to change direction of a fluid flowing through the valve 340 (e.g. the cooling fluid to the cooling circuit 120n of each server 105n). As an example, the valve 340 is thus configured to guide the cooling fluid from the cooling module $230_1$ to the cooling module $230_2$ in FIG. 3B.

Figure 5C:
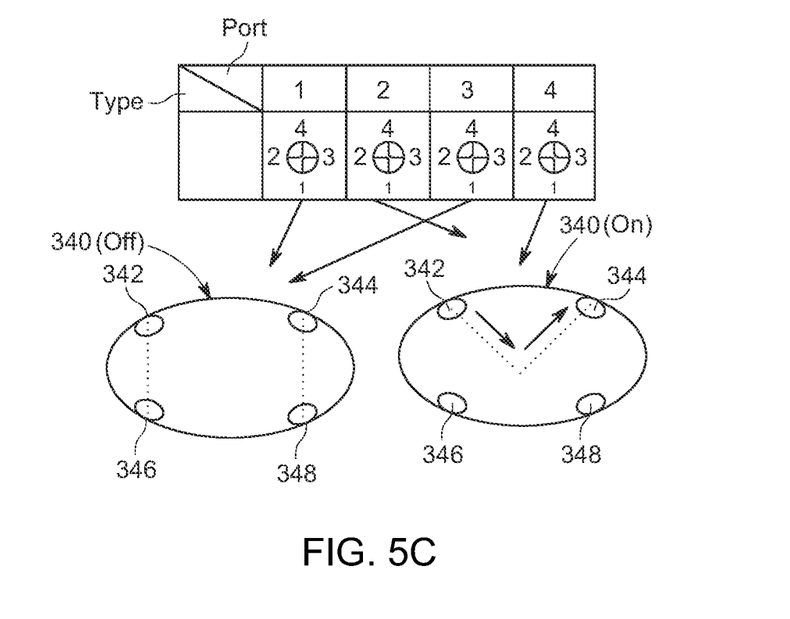
FIG. 5C shows a schematic configuration of "on" and "off" states of the valve of FIG. 5A, according to certain aspects of the present disclosure.

FIG. 5C shows a schematic configuration of "on" and "off" states of the valve 340 of FIGS. 5A-5B. A ball (not shown) in the center of the four-channeled structure 580 (FIG. 5A) may be rotated by the controlling unit 585 to adjust the position of the ports 342, 344, 346, and 348, represented as "1", "2", "3", and "4" respectively in the chart of FIG. 5C. Accordingly, as shown in FIG. 5C, configurations of the ports 1, 2, 3, 4 in the first and the third columns represent an "off" state of the valve 340, and configurations of the ports 1, 2, 3, 4 in the second and fourth columns represents an "on" state of the valve 340.

Figure 6A:
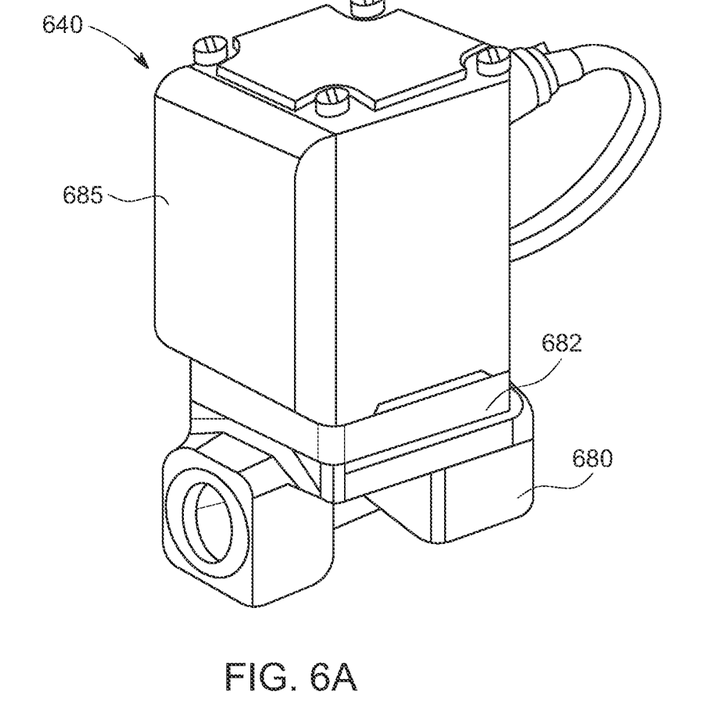
FIG. 6A shows a perspective view of a second embodiment of a valve used for interconnecting the adjacent cooling circuits, according to certain aspects of the present disclosure.
Figure 6B:
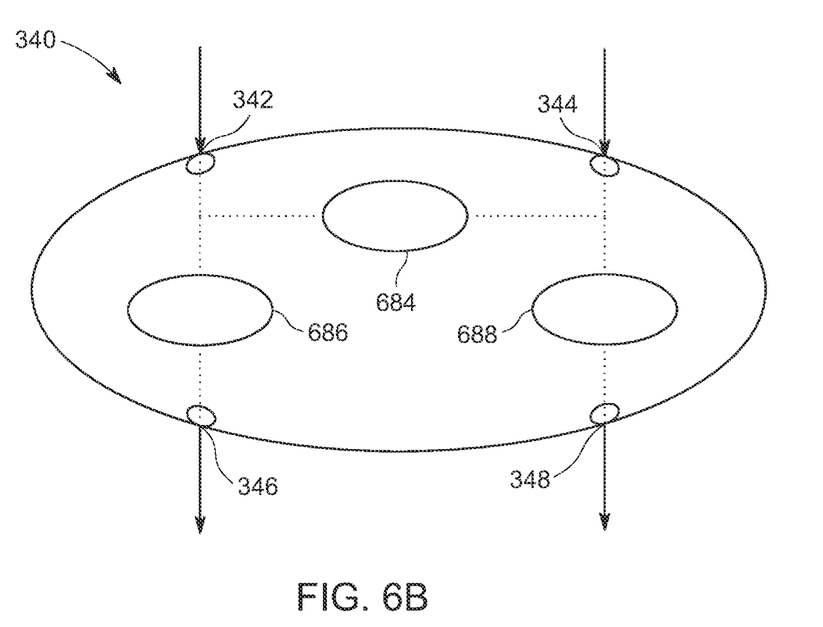
FIG. 6B shows a schematic representation of the valve of FIG. 6A, according to certain aspects of the present disclosure.

FIGS. 6A-6B shows a perspective view and a schematic representation respectively, of a second embodiment of the valve 640 used for interconnecting the adjacent cooling circuits. As shown in FIG. 6A, the valve 640 is a two-pass solenoid valve having a two-channeled structure 680 and a controlling unit 685 coupled to the two-channeled structure 680 through a connector 682. As shown in FIG. 6B, three two-pass solenoid valves 684, 686, 688 form the four-pass valve 340 (see also, FIGS. 3A-3B) through connectors such that the four-pass valve 340 has the four ports 342, 344, 346, and 348. The valve 340 is off when the two-pass solenoid valve 684 is closed and the two-pass solenoid valves 686, 688 are open, such that the port 342 connects with the port 346 and the port 344 connects with the port 348. The valve 340 is on when the solenoid valve 684 is open and the solenoid valves 686, 688 are closed, such that the port 342 connects to the port 344.

Figure 7:
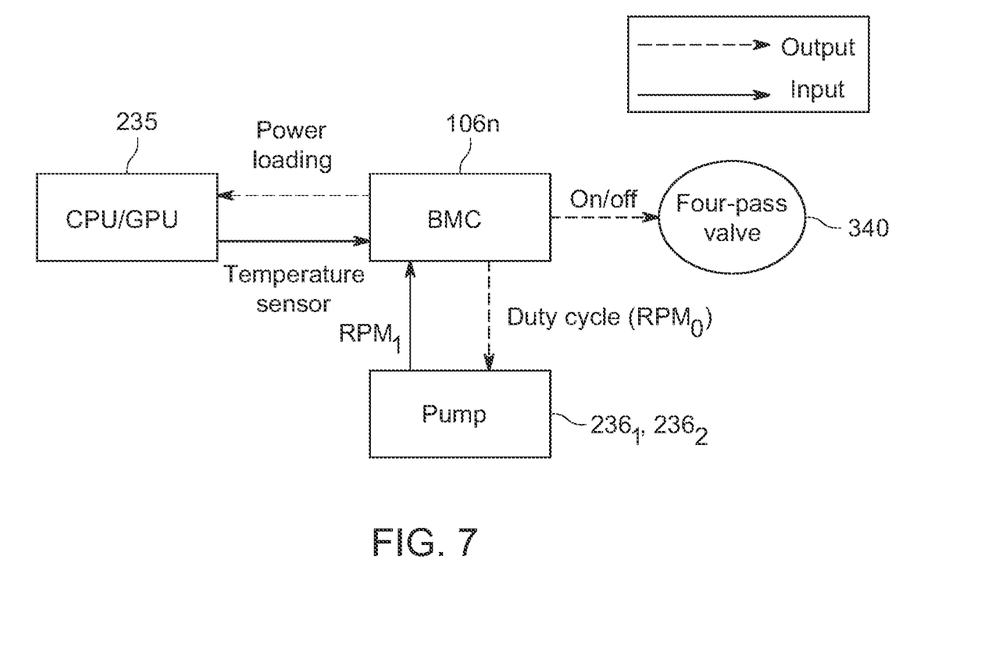
FIG. 7 shows a schematic representation of the operation of a controller in each server of the rack of servers of FIG. 1 to control the cooling circuit of the server, according to certain aspects of the present disclosure.

FIG. 7 shows a schematic representation of the operation of the controller 106n in each server 105n of the rack 100 (FIG. 1). The controller 106n is a baseboard management controller (BMC) that is a specialized microcontroller embedded in the motherboard of each server 105n. The controller 106n has its own firmware and random access memory (RAM). The controller 106n manages the interface between the system-management software and platform hardware of the server 105n and performs a number of functions in the server 105n, as shown in FIG. 7. The controller 106n receives data from sensors (e.g., temperature sensor, cooling fan speed sensor, cooling pump speed sensor, etc.) and determines whether the corresponding system parameters (e.g., temperature, cooling fan speed, cooling pump speed) are operating within predetermined ranges. When the controller 106n determines that a system parameter is outside the predetermined range, it undertakes a remedial action. The remedial action may include notifying an operator, who can then remote communicate with the controller 106n to take corrective action.

As an example, when the controller 106n determines from the received information that the revolutions per minute (RPM) of the one or more pumps $236_1$, $236_2$ (e.g., pumps $236_1$, $236_2$ in the cooling modules $230_1$, $230_2$ respectively in FIGS. 3A-3B) is outside a predetermined range of values, it determines that the corresponding one of the pumps $236_1$, $236_2$ has failed. Consequently, in response to detecting that any one of the pumps $236_1$, $236_2$ has failed, the controller 106n turns on the valve 340 connecting the cooling conduit (e.g., the cooling conduit $234_1$ of the cooling module $230_1$ in FIGS. 3A-3B) having the failed pump with the cooling conduit of an adjacent cooling module (e.g., the cooling conduit $234_2$ of the cooling module $230_2$ in FIGS. 3A-3B). In some embodiments, the controller 106n is also configured to send an alarm or an alert to an operator, in response to detecting at least that all but one of the pumps 236 in the plurality of cooling modules 230 has failed.

As another example, the controller 106n may receive temperature information of the heat-generating component 235 (FIGS. 2A-2B) thermally connected with the cold plate 232 (FIGS. 2A-2B) from the temperature sensors 108n (FIG. 1) in the corresponding server 105n. In response to detecting that the temperature of the heat-generating component 235 is above a predetermined range or that one of the pumps $236_1$, $236_2$ has failed, the controller 106n may adjust an electrical power load on the heat-generating component 235.

Figure 8:
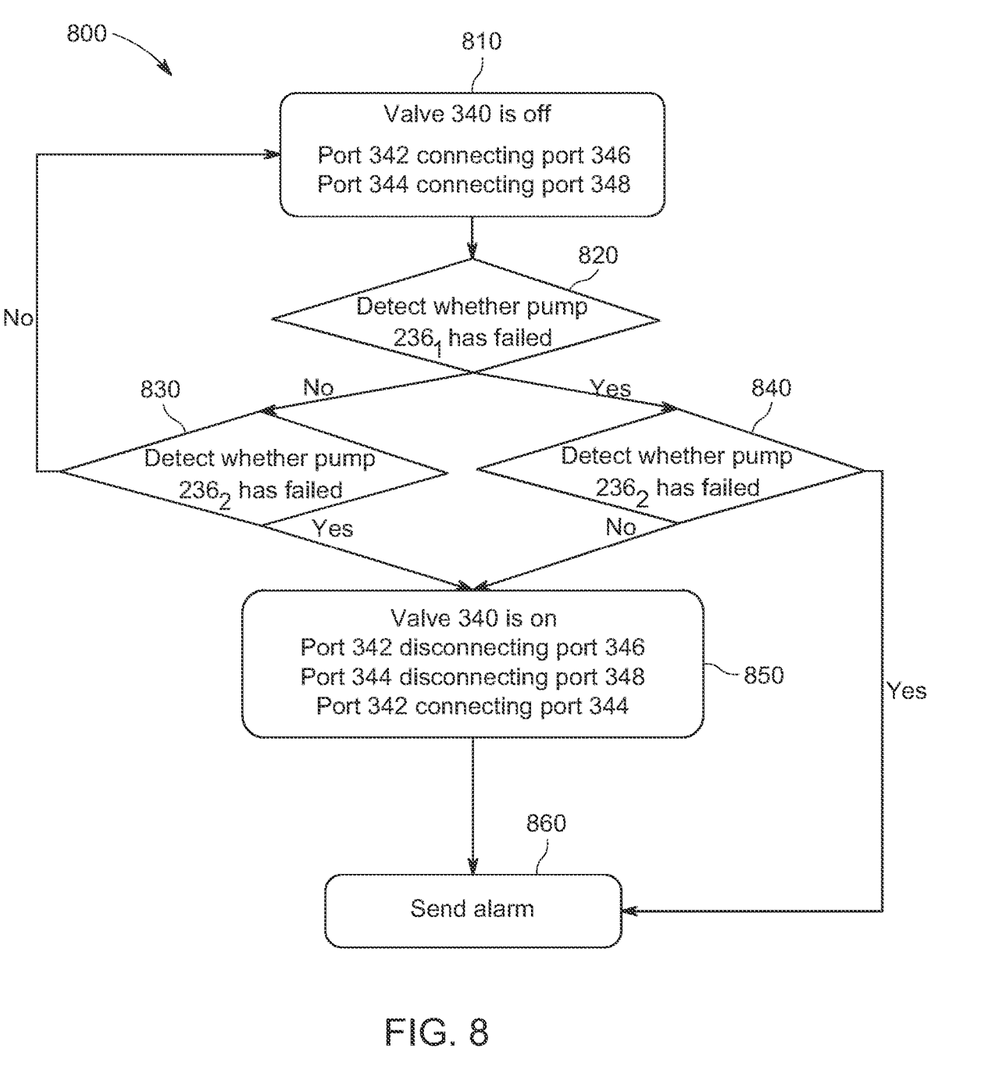
FIG. 8 shows a flow diagram of a flow control method executed by the controller of FIG. 7, according to certain aspects of the present disclosure.

FIG. 8 shows a flow diagram of a flow control method 800 executed by the controller 106n in the server 105n (FIG. 1). The flow control method 800 starts in step 810, where the valve 340 is turned off such that port 342 is connected to port 346 (shown in FIG. 3A) and port 344 is connected to port 348 (shown in FIG. 3A). The flow control method 800 moves to decision point 820 to detect whether pump $236_1$ (shown in FIG. 3B) has failed. If the pump $236_1$ is not determined to have failed at decision point 820, the flow control method 800 moves to decision point 830 to detect whether pump $236_2$ has failed. If the pump $236_2$ is not determined to have failed at decision point 830, the flow control method 800 returns to step 810 to keep the valve 340 turned off. If the pump $236_2$ is determined to have failed at decision point 830, the flow control method 800 moves to step 850 to turn the valve 340 on such that port 342 disconnects from the port 346, the port 344 disconnects from the port 348, and the port 342 connects with the port 344.

If the pump $236_1$ is determined to have failed at decision point 820, the flow control method 800 moves to decision point 840 to detect whether pump $236_2$ has failed. If the pump $236_2$ is not determined to have failed at decision point 840, the flow control method 800 moves to step 850 to turn the valve 340 on such that port 342 disconnects from the port 346, the port 344 disconnects from the port 348, and the port 342 connects with the port 344. If the pump $236_2$ is determined to have failed at decision point 840, the flow control method 800 moves to step 860 to send an alarm to an operator to take remedial action. In some embodiments, the alarm may also be sent from step 850 after turning the valve 340 on to notify the operator that one of the pumps $236_1$, $236_2$ has failed.

Figure 9:
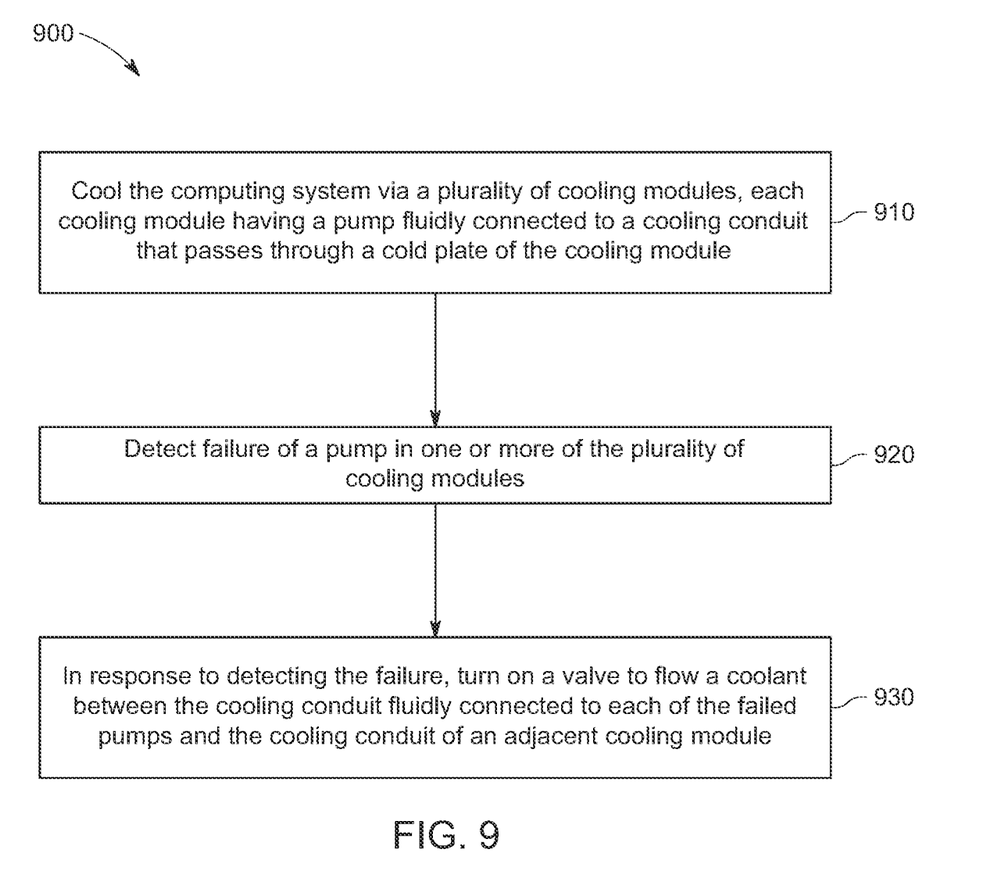
FIG. 9 shows a block diagram of a flow control method for cooling the cooling circuit of each server of FIG. 1, according to certain aspects of the present disclosure.

FIG. 9 shows a block diagram 900 of a flow control method for the cooling circuits (e.g., cooling circuits 120a, 120b, ..., 120n of the respective servers 105a, 105b, ..., 105n in FIG. 1). In block 910, the method cools the computing system via a plurality of cooling modules, where each cooling module has a pump fluidly connected to a cooling conduit that passes through a cold plate of the cooling module.

In block 920, the method detects failure of a pump in one or more of the plurality of cooling modules. In some implementations, detecting the failure may be based on receiving information on revolutions per minute (RPM) of the one or more pumps and determining whether the RPM of any of the one or more pumps is outside a predetermined range of values.

In block 930, in response to detecting the failure, a valve is turned on to flow a coolant between the cooling conduit fluidly connected to each of the failed pumps and the cooling conduit of an adjacent cooling module. In some implementations, the electrical power load on a heat-generating component thermally coupled to the cooling circuit is adjusted, in response to detection of the failure. In some implementations, an alarm may be sent to an operator, in response to detecting at least that all but one of the pumps in the plurality of cooling modules have failed.

Advantageously, the cooling mechanism described herein provides pump redundancy during operation such that heat from the heat-generating components in all parts of the computing devices can continue to be effectively removed, without unnecessary heating of the cooling fluid. The flow of the cooling fluid is automatically adjusted by opening a valve interconnecting adjacent cooling modules, upon detecting failure of one or more pumps configured to drive the cooling fluid in the cooling modules. An alarm is also sent to the operator in the event of critical pump failures that may affect the ability of the cooling modules to continuously remove heat from the heat-generating components.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A cooling circuit for cooling a computing system, the cooling circuit comprising:
   a plurality of cooling modules arranged in parallel, each cooling module including a cold plate having a cooling conduit passing therethrough, and a pump fluidly coupled to the cooling conduit, the plurality of cooling modules including
      a first cooling module having a first cooling conduit with a first inlet tube and a first outlet tube; and
      a second cooling module having a second cooling conduit with a second inlet tube and a second outlet tube, the second inlet tube being adjacent to the first outlet tube; and
   one or more valves fluidly interconnecting the plurality of cooling modules, each of the one or more valves, when turned on, fluidly connecting the cooling conduits of any two adjacent cooling modules, the cooling conduits flowing cooling fluid independent of each other when the one or more valves are turned off, at least one of the one or more valves being a single four-pass valve having four ports that include
      a first inlet port fluidly coupled with the first outlet tube to receive cooling fluid flowing through the first cooling module,
      a first outlet port fluidly coupled with the first outlet tube downstream from the first inlet port,
      a second inlet port fluidly coupled with the second inlet tube to receive cooling fluid flowing through the second cooling module, and
      a second outlet port fluidly coupled with the second inlet tube downstream from the second inlet port, the second outlet port being in fluid communication with the first inlet port when the single four-pass valve is turned on to flow cooling liquid between the first cooling conduit and the second cooling conduit.

2. The cooling circuit of claim 1, wherein each of the first and second inlet tubes has a first end coupled to a quick connector and a second end coupled to an inlet of the respective first and second cooling conduits, and wherein each of the first and second outlet tubes has a first end coupled to an outlet of the respective first and second cooling conduits and a second end coupled to a quick connector.

3. The cooling circuit of claim 1, wherein the one or more valves are (i) a four-pass actuated ball valve, (ii) a four-pass valve formed by three two-pass solenoid valves, or (iii) any combination thereof.

4. The cooling circuit of claim 1, wherein each of the plurality of cooling modules is disposed above a heat-generating component of the computing system.

5. A cooling system for a rack of servers comprising:
   a plurality of cooling circuits, each cooling circuit coupled to a server of the rack and comprising:
      a plurality of cooling modules arranged in parallel, each cooling module including a cold plate having a cooling conduit passing therethrough, and a pump fluidly coupled to the cooling conduit, the plurality of cooling modules including
         a first cooling module having a first cooling conduit with a first inlet tube and a first outlet tube; and
         a second cooling module having a second cooling conduit with a second inlet tube and a second outlet tube, the second inlet tube being adjacent to the first outlet tube; and
      one or more valves fluidly interconnecting the plurality of cooling modules, each of the one or more valves, when turned on, fluidly connecting the cooling conduits of any two adjacent cooling modules, the cooling conduits flowing cooling fluid independent of each other when the one or more valves are turned off, at least one of the one or more valves being a single four-pass valve having four ports that include
         a first inlet port fluidly coupled with the first outlet tube to receive cooling fluid flowing through the first cooling module,
         a first outlet port fluidly coupled with the first outlet tube downstream from the first inlet port,
         a second inlet port fluidly coupled with the second inlet tube to receive cooling fluid flowing through the second cooling module, and
         a second outlet port fluidly coupled with the second inlet tube downstream from the second inlet port, the second outlet port being in fluid communication with the first inlet port when the single four-pass valve is turned on to flow cooling liquid between the first cooling conduit and the second cooling conduit; and
   a first cooling distribution manifold fluidly connected to the cooling circuit of each of the plurality of servers through an inlet pipe; and
   a second cooling distribution manifold fluidly connected to the cooling circuit of each of the plurality of servers through an outlet pipe.

6. The cooling system of claim 5, wherein each of the first and second inlet tubes has a first end coupled to a quick connector and a second end coupled to an inlet of the respective first and second cooling conduits, and wherein each of the first and second outlet tubes has a first end coupled to an outlet of the respective first and second cooling conduits and a second end coupled to a quick connector.

7. The cooling system of claim 5, wherein the one or more valves are (i) a four-pass actuated ball valve, (ii) a four-pass valve formed by three two-pass solenoid valves, or (iii) any combination thereof.

8. The cooling system of claim 5, wherein each of the plurality of cooling modules is disposed above a heat-generating component of the corresponding server.

9. The cooling system of claim 5, further comprising a cooling distribution unit disposed on the rack of servers for distributing a cooling fluid to the first cooling distribution manifold and receiving the cooling fluid from the second cooling distribution manifold.

10. The cooling system of claim 9, wherein the cooling distribution unit further comprises:
one or more sensors configured to detect one or more flow parameters of the cooling fluid;
a cooling distribution pump configured to controllably distribute the cooling fluid; and
a programmable logic controller configured to control the flow rate of the cooling fluid from the cooling distribution pump based on data received on the one or more flow parameters of the cooling fluid.

11. The cooling system of claim 5, wherein each cooling circuit is communicatively coupled to a controller in the corresponding server, the controller configured to:
detect whether one or more of the pumps in the plurality of cooling modules has failed; and
turn on the one or more valves fluidly connecting the cooling conduit of the cooling module having each of the one or more failed pumps with the cooling conduit of an adjacent cooling module, in response to such detection.

12. The cooling system of claim 11, wherein the controller is further configured to:
receive temperature information of a heat-generating component thermally connected with the cold plate from a temperature sensor in the corresponding server; and
adjust an electrical power load on the heat-generating component, in response to detecting that the one or more of the pumps in the plurality of cooling modules has failed.

13. The cooling system of claim 11, wherein the controller is further configured to send an alarm to an operator, in response to detecting at least that all but one of the pumps in the plurality of cooling modules has failed.

14. The cooling system of claim 11, wherein the controller is further configured to detect whether the one or more pumps has failed by:
receiving information on revolutions per minute (RPM) of the one or more pumps; and
determining whether the RPM of any of the one or more pumps is outside a predetermined range of values.

* * * * *